United States Patent [19]

Reed et al.

[11] Patent Number: 4,935,935
[45] Date of Patent: Jun. 19, 1990

[54] WAVELENGTH TUNABLE ELECTRONIC AND ELECTROOPTICAL SEMICONDUCTOR DEVICES

[75] Inventors: Michael L. Reed, O'Hara Township, Allegheny County; Tuviah E. Schlesinger, Mount Lebanon Township, Allegheny County, both of Pa.

[73] Assignee: Carnegie Mellon University, Pittsburgh, Pa.

[21] Appl. No.: 365,204

[22] Filed: Jun. 12, 1989

Related U.S. Application Data

[63] Continuation-in-part of Ser. No. 239,119, Aug. 31, 1988, abandoned.

[51] Int. Cl.[5] .................... H01S 3/19; H01L 23/42
[52] U.S. Cl. ................................ 372/44; 357/17; 357/26; 357/75; 357/79; 372/46
[58] Field of Search ................... 372/43, 44, 45, 46; 357/79, 26, 30, 75, 17

[56] References Cited

U.S. PATENT DOCUMENTS

| | | | |
|---|---|---|---|
| 3,483,487 | 12/1969 | Nanney | 332/7.51 |
| 3,513,356 | 5/1970 | Newell | 317/101 |
| 3,676,795 | 7/1972 | Pratt, Jr. | 331/94.5 |
| 3,827,002 | 7/1974 | Chao | 333/72 |
| 4,675,719 | 6/1987 | Imai | 357/75 |

*Primary Examiner*—William L. Sikes
*Assistant Examiner*—Georgia Y. Epps
*Attorney, Agent, or Firm*—Buchanan Ingersoll

[57] ABSTRACT

This invention relates to an electrically tunable semiconductor device. At least one thin film of piezoelectric substance is positioned in stress transmitting relation to the semiconductor-device and a signal from an electrical circuit causes the piezoelectric to transmit stress to the semiconductor thereby varying the response of the semiconductor device.

20 Claims, 6 Drawing Sheets ns
WAVELENGTH TUNABLE ELECTRONIC AND ELECTROOPTICAL SEMICONDUCTOR DEVICES This application is a continuation-in-part of our application Ser. No. 239,119 filed Aug. 31, 1988 now abandoned.

This invention relates to semiconductor devices and is more particularly concerned with electrically wavelength tunable semiconductor devices.

BACKGROUND OF THE INVENTION

Semiconductor devices include, among others, light emitting diodes, photo diodes, laser devices, quantum well, superlattice and graded-band-gap devices. These devices, of which lasers are perhaps the best known, generally have a fixed spectral response, that is, emission wavelength, absorption edge, etc. Their use in many fields such as molecular spectroscopy, atmospheric absorption, spectroscopy for pollution detection, heterodyne detection of microwave emissions, laser isotope separation and frequency modulation in optical communications could be expanded greatly if such devices could be readily electrically tunable. It is known that dynamic single mode lasers can be tuned over a restricted wavelength range by adjusting their temperatures. It has been known for many years that certain semiconductor devices can be tuned by applying pressure to the semiconductors but because of the extremely high pressures required no satisfactory devices embodying that principle have hitherto been produced.

SUMMARY OF THE INVENTION

While our invention is adaptable to many semiconductor devices, it is most conveniently described with respect to semiconductor lasers such as the GaAs/Al$_x$Ga$_{1-x}$As semiconductor lasers. They conventionally comprise a body, which is generally rectangular in cross-section, of the semiconductor, with electrodes affixed to the upper and lower surface of the body. When a pumping or exciting voltage is applied across those electrodes the laser emits an axial beam of light having a wavelength determined by the size of its energy gap $E_g$. In our invention we position a film of piezoelectric substance against the side of the semiconductor, preferably one such film on each side. Each film has an electrode affixed to it, which electrodes are connected together. The semiconductor and the piezoelectric film may have a common ground. A pumping voltage is applied between the top electrode of the semiconductor and ground and a tuning voltage is applied between the terminal of the piezoelectric films and ground. The piezoelectric films deform in proportion to the tuning voltage and apply stress to the semiconductor. This stress varies the semiconductor energy gap and hence affects the wavelength of the laser beam generated by the pumping voltage. Variation of the laser beam wavelength is limited only by the pressure that can be applied by the piezoelectric film.

DESCRIPTION OF THE PREFERRED EMBODIMENTS

Figure 1:
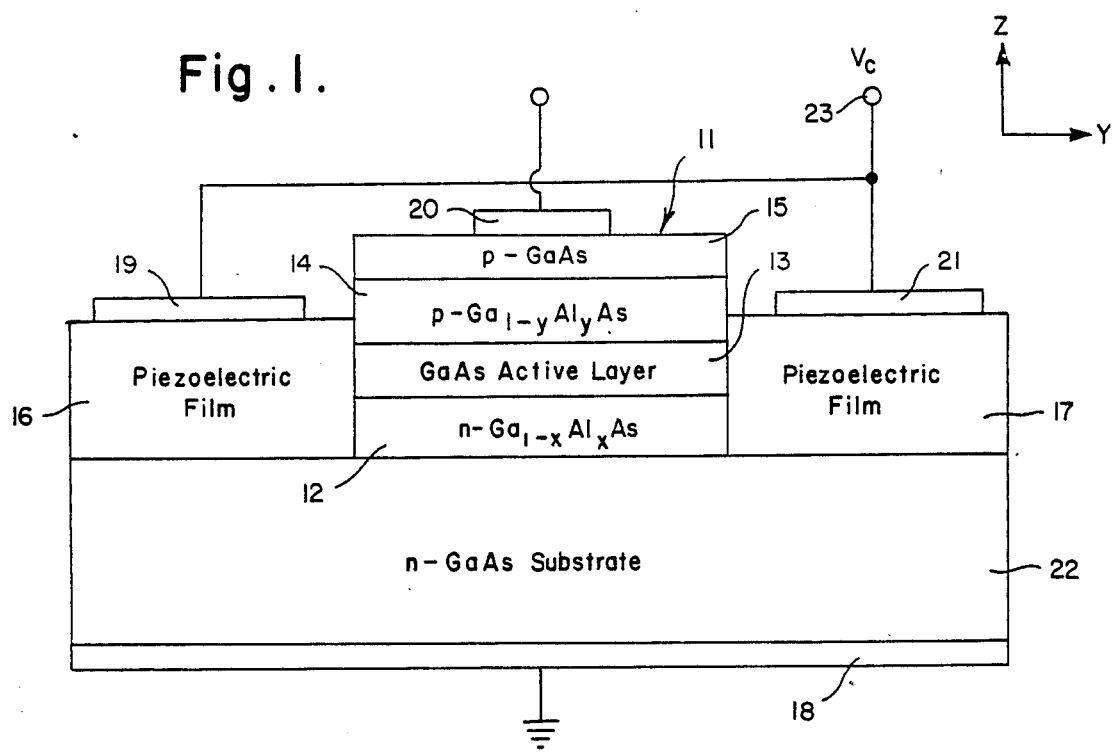
FIG. 1 is a schematic cross-section of a tunable semiconductor laser of our invention.

Semiconductor laser 11 of rectangular cross-section is shown in FIG. 1. It has a bottom layer 12 of n-Ga$_{1-x}$Al$_x$As; superimposed thereon is a layer 13 of active GaAs; superimposed thereon is a layer 14 of p-Ga$_{1-y}$Al$_y$As and a top layer 15 of p-GaAs. The semiconductor 11 is fabricated on a substrate 22 of n-GaAs which extends beyond the semiconductor 11 on both sides. On one side of that substrate is deposited a piezoelectric film 16 adjoining the side of semiconductor 11. On the other side of the substrate is formed a similar piezoelectric film 17 adjoining the other side of the semiconductor 11. An electrode 19 is positioned on top of film 16, an electrode 21 is positioned on top of film 17, an electrode 20 is positioned on top of semiconductor 11, and substrate 22 is connected to electrode 18. Electrodes 19 and 21 are connected together at junction 23. The pumping voltage is applied between electrodes 20 and 18. Electrodes 19 and 21 are connected together and tuning voltage is applied between junction 23 and electrode 18. The tuning voltage causes piezoelectric films 16 and 17 to deform against semiconductor laser 11 on each side and the stress so generated varies the energy gap $E_g$ of the semiconductor laser 11, so varying the wavelength of its emission.

Figure 2:
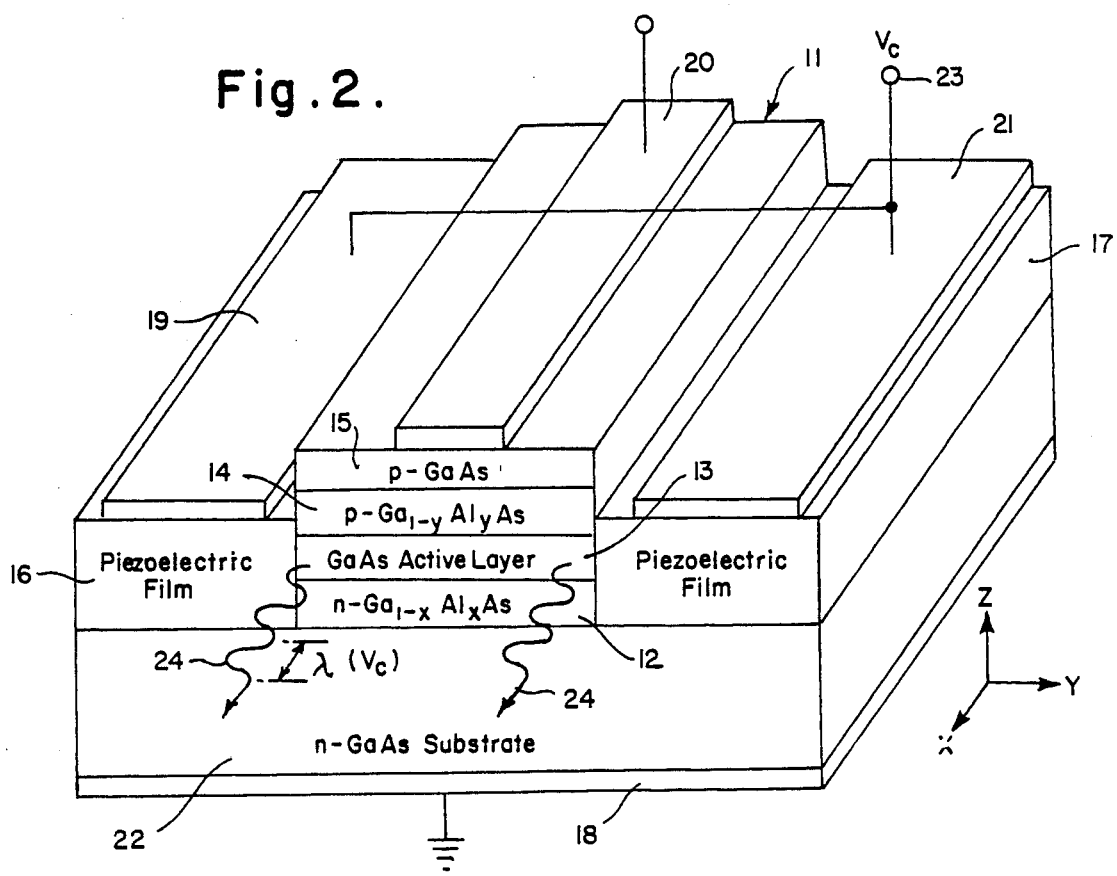
FIG. 2 is an isometric drawing of the article of FIG. 1.

The action of our device is shown somewhat more graphically in FIG. 2 where the same reference characters of all elements shown in FIG. 1 are applied to those elements in FIG. 2. The emission of semiconductor laser 11 is shown diagrammatically as beams 24 having a wavelength λ in the direction indicated.

Figure 3:
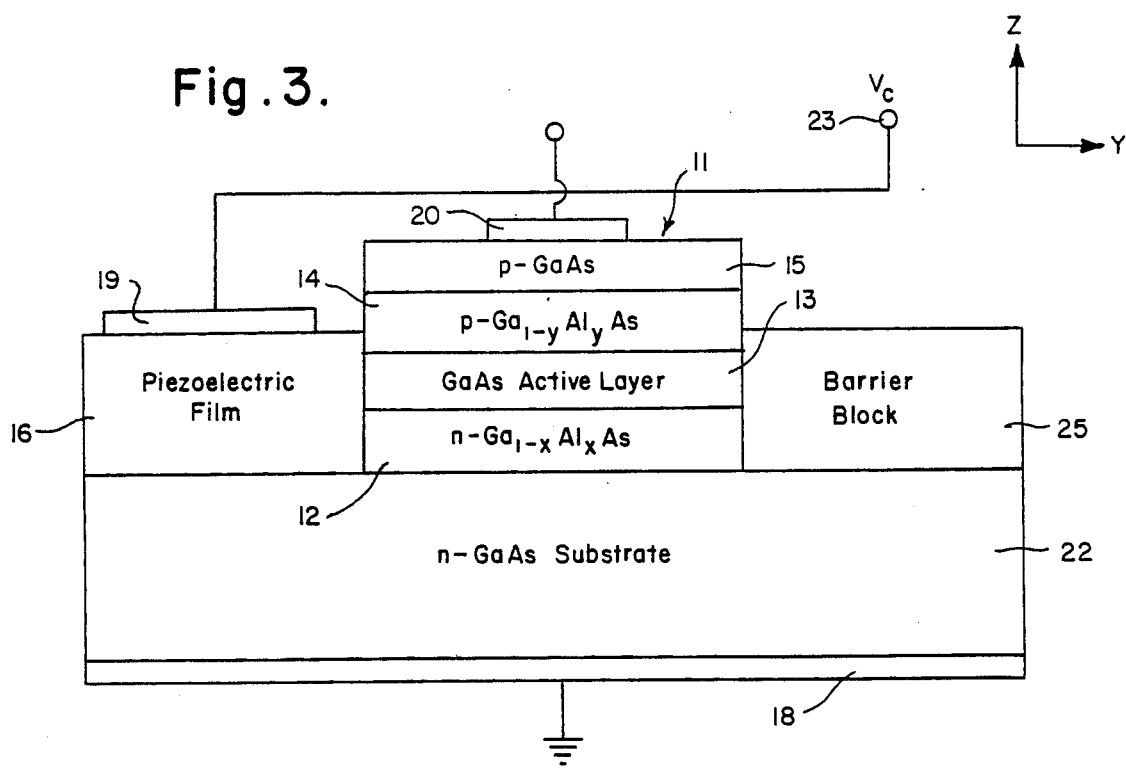
FIG. 3 is quite similar to FIG. 1 but illustrates a slight variation in design.

While we prefer to apply voltage to our semiconductor device from both sides through piezoelectric films 16 and 17, as is shown in FIGS. 1 and 2, we can also vary the wavelength of a semiconductor device with one piezoelectric element, such as is shown in FIG. 3. There piezoelectric film 17 has been replaced by an inactive barrier 25 which may be part of substrate 22, or of other material. The other components of FIG. 3 carry the same reference characters as their counterparts in FIGS. 1 and 2. The deformation of piezoelectric film 16 causes semiconductor laser 11 to be compressed or tensioned against barrier 24, thus varying its energy gap $E_g$.

Figure 4:
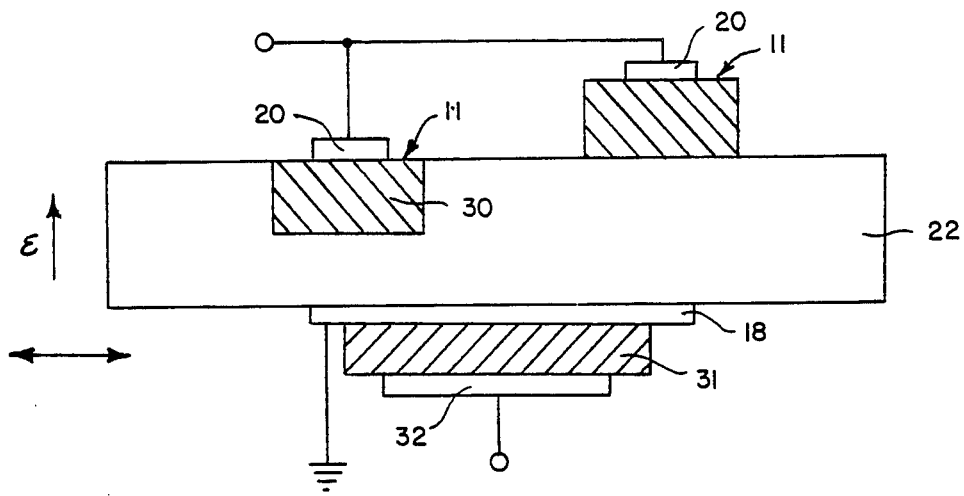
FIG. 4 is a schematic cross-section of another embodiment of our invention in which a pressure sensitive semiconductor device is mounted on a substrate or alternatively sunk into a cavity or well in the substrate, to the underside of which is affixed a body of piezoelectric substance between two electrodes. The figure illustrates both alternatives. In the figure and in each of the following figures the semiconductor device is not shown in detail. The electric field $\epsilon$ produced by the tuning voltage is indicated by a single arrow, while the stress generated by the deformation of the piezoelectric films is indicated by a pair of arrows.

In FIG. 4 semiconductor laser 11 may be positioned above substrate 22 or may be positioned in a cavity 30 therein. In either case it has an electrode 20 on its upper surface and substrate 22 is provided with an electrode 18 on its lower surface. The pumping voltage is applied between those electrodes. A film 31 of piezoelectric substance is affixed to the underside of electrode 18 and the lower surface of film 31 is provided with an electrode 32. Tuning voltage is applied between electrodes 18 and 32, causing piezoelectric film 31 to deform as is shown by the double-headed horizontal arrow in the figure, generating a stress that is transmitted through substrate 22 to laser diode 11 in the direction shown by the horizontal arrow.

Figure 5:
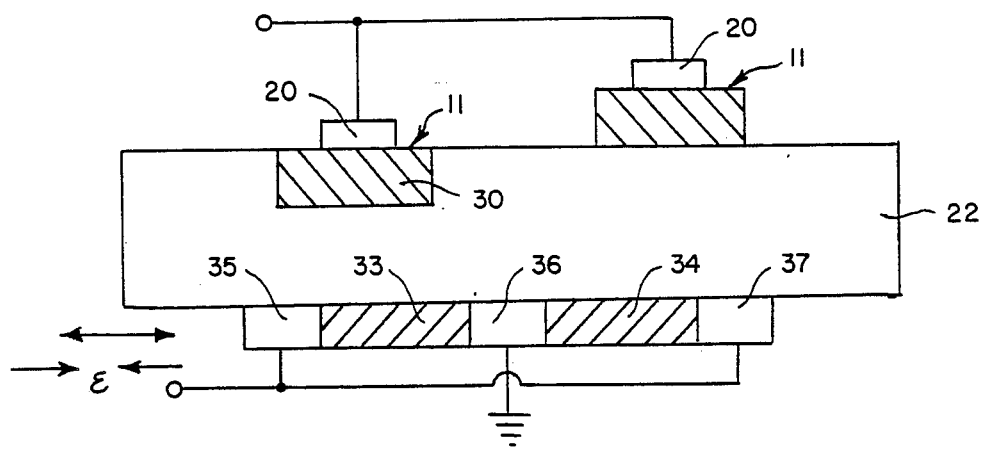
FIG. 5 is similar to FIG. 4 except that two piezoelectric films adjoining the three electrodes are affixed to the underside of the substrate. The electric field $\epsilon$ is parallel to the plane of the substrate.

In FIG. 5 the position of the laser diode 11 with respect to substrate 22 is the same as in FIG. 4. On the lower surface of substrate 22, however, are deposited films of piezoelectric substances 33 and 34 separated from each other by electrode 36 and abutting at their outside ends electrodes 35 and 37 respectively. Pumping voltage is applied to laser diode 11 between electrodes 20 and 36. Tuning voltage is applied to piezoelectric films 33 and 34 between electrode 36 and electrically connected electrodes 35 and 37. The piezoelectric films 33 and 34 deform in directions, as shown by the double-headed arrow depending upon the respective polarity of the tuning voltage.

Figure 6:
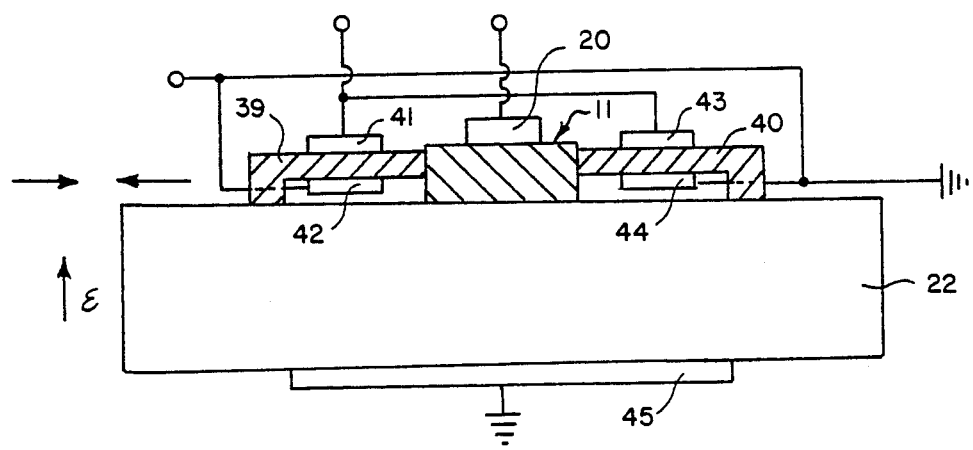
FIG. 6 illustrates a configuration in which the stress generated in the body of the piezoelectric substance is not transmitted to the substrate.

The structure of FIG. 6 is designed to isolate the substrate 22 from stresses generated by the piezoelectric films. Laser diode 11, as before, is positioned on the upper surface of substrate 22 and carries an electrode 20 on its upper surface. Piezoelectric films 39 and 40 are formed as shown so that one end of each abuts laser diode 11 on opposite sides and the other end of each abuts substrate 22 but with no contact between them and the substrate intermediate those ends. Electrodes 41 and 42 are affixed to the upper and lower faces respectively of piezoelectric film 39 and electrodes 43 and 44 to the upper and lower faces respectively of piezoelectric body 40, electrodes 41 and 43 being connected together and electrodes 42 and 44 being connected together. An electrode 45 is affixed to the lower surface of substrate 22 and the pumping voltage is applied between electrodes 20 and 45. Tuning voltage is applied between electrodes 41 and 42 and between electrodes 43 and 44. The piezoelectric films 39 and 40 deform, as is shown by the opposed arrows, and transmit stress to the semiconductor device 11.

Figure 7:
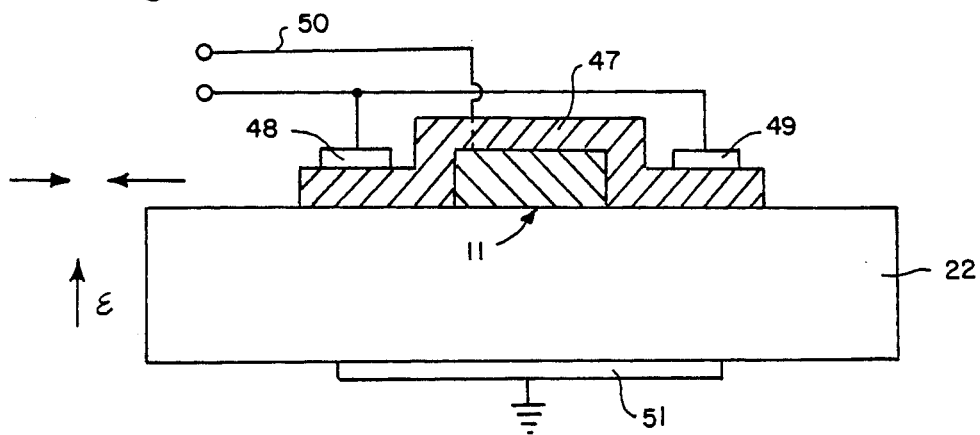
FIG. 7 shows an arrangement in which the semiconductor body, except for its base on the substrate, is completely encapsulated by the piezoelectric substance.

FIG. 7 illustrates a structure in which the laser diode 11 is encapsulated or covered, except for its mounting on substrate 22, by piezoelectric substance 47 which extends outwardly on substrate 22 on each side of laser diode 11. An electrode 48 is affixed to one such extension and an electrode 49 to the other. An electrode 51 is affixed to the lower surface of substrate 22. A connection 50 with the upper surface of laser diode 11 extends through the piezoelectric substance and pumping voltage is applied between connection 50 and electrode 51. Electrodes 48 and 49 are connected together and tuning voltage is applied between those electrodes and electrode 51. The piezoelectric substance deforms in a direction parallel to substrate 22, as is shown by the opposed arrows, and the stress generated thereby is transmitted to the semiconductor device 11.

Figure 8A:
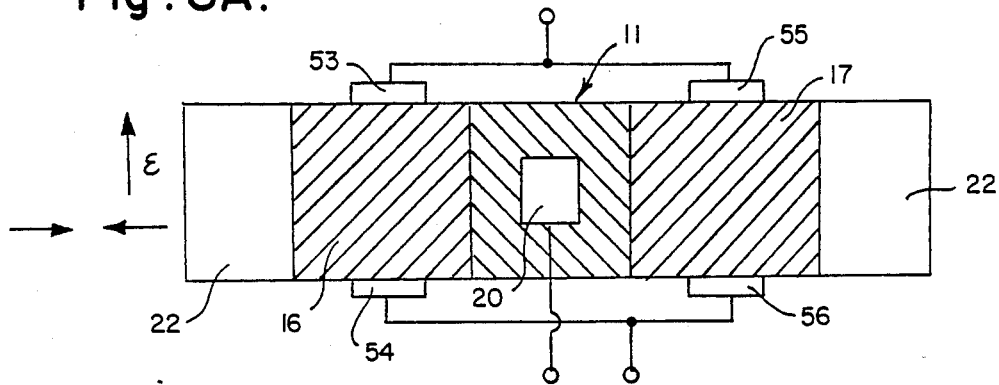
FIGS. 8A and 8B are plan and elevation respectively of a semiconductor device mounted between piezoelectric substances on a substrate with the electrodes at the sides of the piezoelectric films.
Figure 8B:
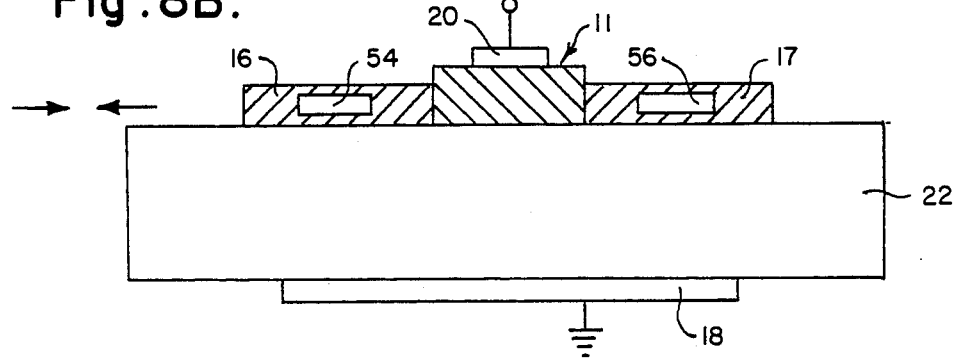

FIGS. 8A and 8B are plan and elevation, respectively, of an arrangement not greatly different from that of FIG. 1 except in the location of the piezoelectric films and electrodes. Those films, which are identical with films 16 and 17 in FIG. 1, and therefore have the same reference characters, have electrodes on each side as is best shown in FIG. 8A. Piezoelectric film 16 has oppositely positioned electrodes 53 and 54 while piezoelectric film 17 has oppositely positioned electrodes 55 and 56. The electrodes 53 and 55 are connected together and electrodes 54 and 56 are connected together. Pumping voltage is applied between electrode 20 on the upper surface of laser diode 11 and electrode 18 on the lower surface of substrate 22. Tuning voltage is applied between electrodes 53 and 54 and between electrodes 55 and 56. The direction of the deformation of the piezoelectric films and the resultant pressure exerted on the laser diode thereby is the same as for the embodiment of FIG. 1.

Figure 9:
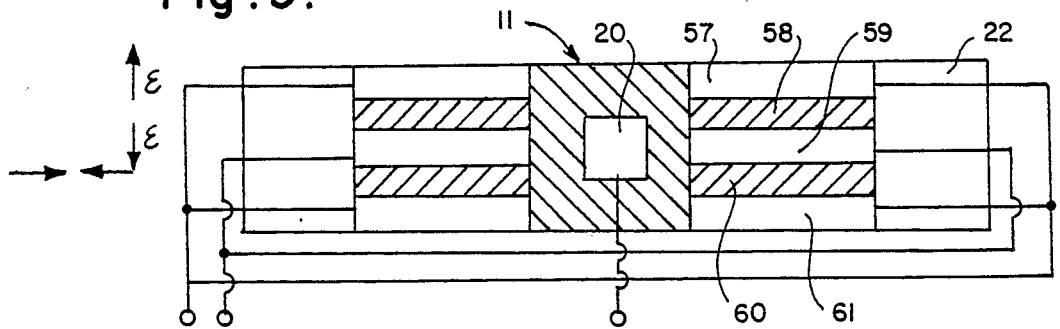
FIG. 9 is a plan of an arrangement similar to that in FIG. 8A but with interdigitated electrodes and piezoelectric films.

The structure of FIG. 9 is a modification of the structure of FIG. 8 and is shown in plan only. Instead of mounting piezoelectric films 16 and 17 abutting laser diode 11, the films are subdivided into thin film sections normal with respect to laser diode 11 and to substrate 22 interdigited or sandwiched with flat electrodes. In the figure, the outer sections 57 and 61 and the center section 59 are electrodes and the intermediate sections 58 and 60 are piezoelectric films. The same arrangement is found on the other side of the laser diode. Electrode 59 on one side is connected with the corresponding electrode on the other side. Electrodes 57 and 61 are connected together and with corresponding electrodes on the other sides. Pumping voltage is applied between the upper and lower surfaces of the laser diode as is shown in FIG. 8B and tuning voltage is applied between the center electrode 59 and outer electrodes 57 and 61 on each side. The direction of deformation and transmitted force is the same as in FIG. 8A.

Figure 10:
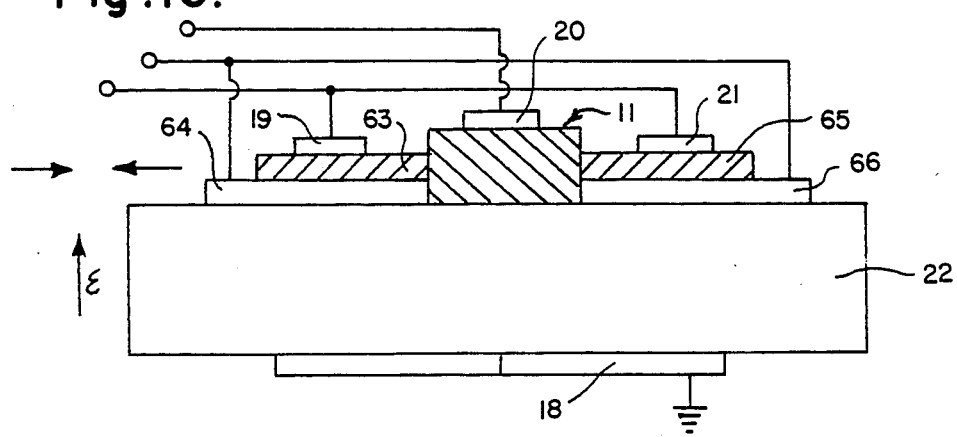
FIG. 10 is similar to FIG. 1 but with electrodes immediately below the films of piezoelectric substances.

FIG. 10 illustrates a structure having electrodes for the piezoelectric films wholly separate from electrodes for the laser diode. It is similar to FIG. 1 in placement of laser diode 11 on substrate 22 with electrode 20 on the upper surface of laser diode 11 and electrode 18 on the lower surface of substrate 22 with pumping voltage connected there between. Piezoelectric films 63 and 65, however, positioned against laser diode 11, one on each side, are not mounted in contact with substrate 22 but each on a separate electrode 64 and 66 respectively, each affixed to the substrate. Electrodes 19 and 21 on the upper surface of piezoelectric film 63 and 65 respectively are connected together, electrodes 64 and 66 are connected together, and tuning voltage is applied between the connected upper and connected lower electrodes above mentioned. The direction of deformation and transmitted force is the same as for the structure of FIG. 1, as is shown by the arrows.

Figure 11:
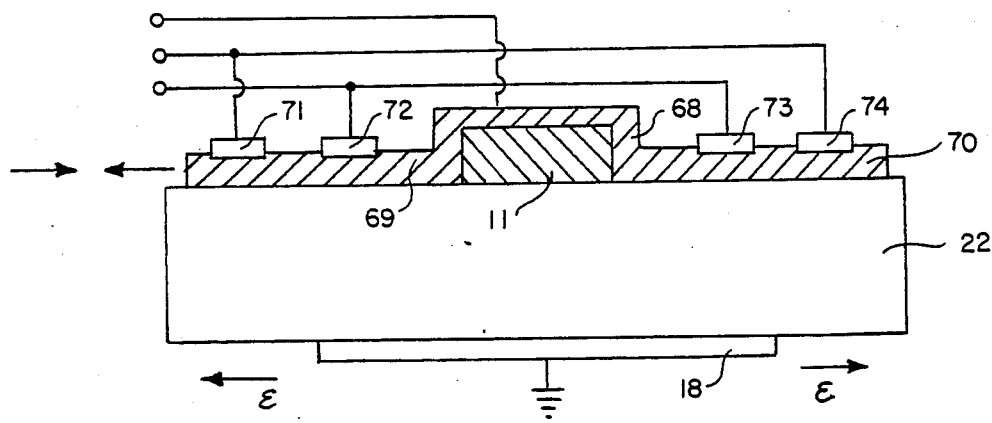
FIG. 11 is similar to FIG. 7 but with electrodes buried in the piezoelectric substance.

The arrangement of FIG. 11 is an elaboration of FIG. 7 but, like the device of FIG. 10, with the pumping drive wholly separate from the tuning drive. Laser diode 11 is mounted on substrate 22 and is encapsulated in piezoelectric substance 68, except for its contact with its substrate. Substance 68 extends on each side of laser diode as 69 and 70 respectively. In extension 69 are embedded electrodes 71 and 72 in line with laser diode 11 and in extension 70 are embedded electrodes 73 and 74 likewise in line. The two innermost electrodes 72 and 73 are connected electrically, the two outermost electrodes 71 and 74 are connected electrically, the tuning voltage is applied between the connected pairs. A lead from the upper face of the laser diode 11 is brought out through piezoelectric substance 68 and the pumping voltage applied between that lead and the electrode 18 on the underside of substrate 22. The direction of deformation of the piezoelectric substance is the same as that in FIG. 7.

Figure 12:
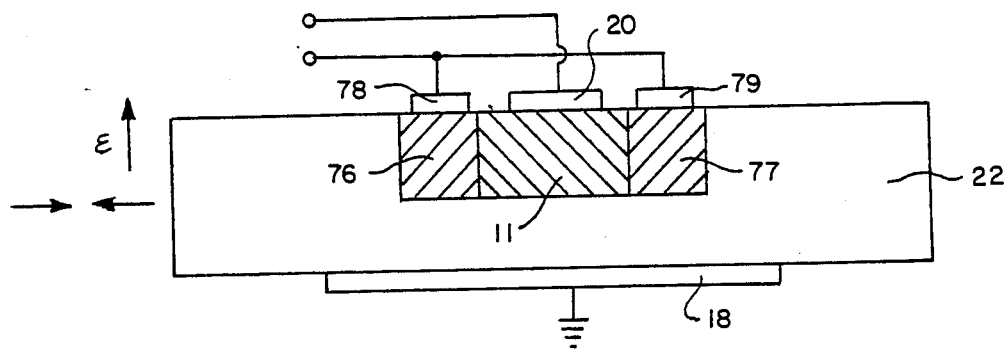
FIG. 12 illustrates a device with semiconductor body and piezoelectric films buried in trenches in the substrate.

FIG. 12 represents a trench structure in which the laser diode 11 and piezoelectric films 76 and 77 are buried in cutouts in substrate 22, one on each side of laser diode 11 and contiguous thereto. Piezoelectric film 76 has an electrode 78 on its upper surface. Piezoelectric film 77 has a similar electrode 79, which two electrodes are connected together and laser diode 11 has a surface electrode 20. An electrode 18 is affixed to substrate 22. The pumping voltage is applied between electrodes 18 and 20 and the tuning voltage between connected electrodes 78 and 79 and electrode 18. The direction of the deformation of the piezoelectric bodies and the transmitted force is the same as FIG. 1, as shown by the arrows.

Figure 13:
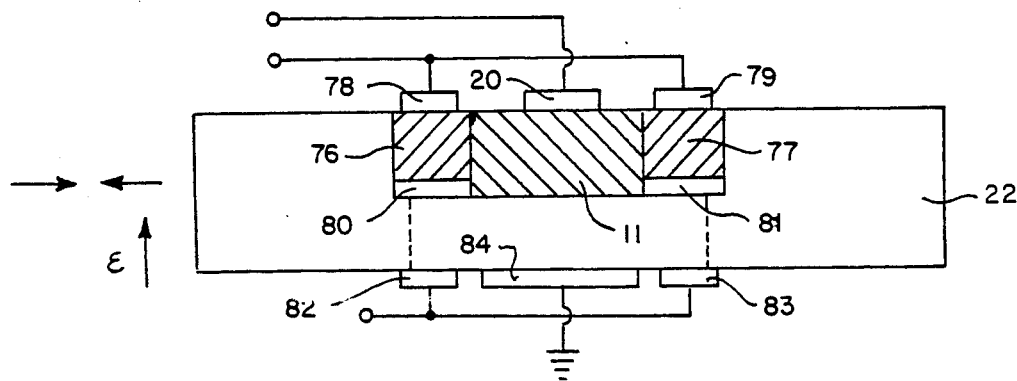
FIG. 13 is somewhat similar to FIG. 12 but with electrodes positioned below the piezoelectric films in their trenches.

The arrangement of FIG. 13 differs from that of FIG. 12 only in having electrodes 80 and 81 at the lower surfaces of piezoelectric films 76 and 77 respectively. Those electrodes are shown as being connected through substrate 22 with bottom electrodes 82 and 83 which are connected together. Tuning voltage is applied between electrodes 78 and 79 and 82 and 83 and pumping voltage between electrode 20 and bottom electrode 84. The lead from electrodes 80 and 81 could, of course, be brought out on the upper surface of substrate 22. The direction of the piezoelectric deformation and the transmitted force is the same as the device of FIG. 10.

Figure 14:
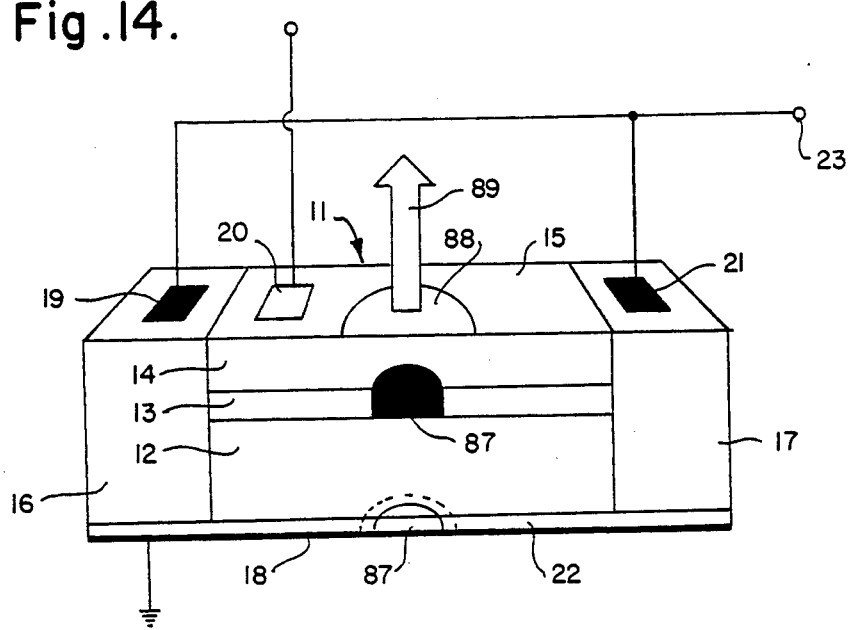
FIG. 14 is an example of our invention embodying a surface emitting semiconductor laser.

In FIG. 14 electrode 18, substrate 22, piezoelectric films 16 and 17 and electrodes 19 and 21 correspond to elements so identified in FIGS. 1 and 2 hereof. The semiconductor device 11 positioned on substrate 22 between piezoelectric films 16 and 17 comprises the layers 12, 13, 14 and 15 of the same composition and arrangement as the layers so identified in FIGS. 1 and 2, and a top electrode 20 corresponds to electrode 20 of those figures. Layer 13 of active GaAs has a central active region 86. Below that region in substrate 22 is a mirror area 87 and above region 86 in layer 15 is a mirror 88 which is not totally reflecting but allows some emission to escape through it as is shown by arrow 89. As in FIGS. 1 and 2, the pumping voltage is applied between electrodes 20 and 18. The tuning voltage is applied between terminal 23 and ground electrode 18. Radiation is emitted from active region 86 when pumping voltage is applied. Layers 12 and 14 immediately above and below active region 86 are permeable to that radiation, which is reflected back and forth between mirrors 87 and 88, emitting a portion through mirror 88. Variation of the tuning voltage between terminal 23 and ground electrode 18 varies the wavelength $\lambda$ of the output radiation.

For piezoelectric films 17 and 18 substances such as $BaTiO_3$, $ZnO$, or $Pb(Zr,Ti)O_3$ may be used. The piezoelectric films can be deposited by chemical vapor deposition, sputtering, epitaxy, or other techniques.

The pressure required to affect semiconductor laser emission is quite high as the energy/pressure coefficient is quite small, about $10^{-10}$ eV/Pa in GaAs. A 10% change in $\lambda$ requires an applied pressure on the order of $10^9$ Pa, or about 10,000 atmospheres. Generating such pressure by conventional means is impractical. We avoid the problems of conventional pressure cells by utilizing piezoelectric thin films integrated with the semiconductor device. With small contact areas between piezoelectric film and the semiconductor device, high stresses can be generated in the semiconductor without the need for bulky and expensive pressure chambers.

Tuning sensitivity $(d\lambda)/(dv_c)$ can be estimated by determining the stress generated in the piezoelectric film. Barium Titanate, $BaTiO_3$, has a stress coefficient $e_{31}$ of approximately 10 coul/m$^2$; $e_{31} = T_y/\epsilon_z$, where $T_y$ is the stress in the y-direction and $\epsilon_z$ is the electric field established by the tuning potential. With a piezoelectric film thickness of 0.4 $\mu$m an applied bias between terminal 23 and substrate 18 of FIG. 1 of about 20 V will produce approximately a 10% wavelength change, about 800Å ($\Delta\nu = 35$ THz) for an 800Å unstressed wavelength.

The tuning voltage may be dc, adjustable if desired, or an ac signal. The tuning voltage modulates the response of the semiconductor device at the frequency of that signal.

Thin films and methods of depositing thin films on a semiconductor substrate are well known. Thicknesses of such films range from less than an atomic monolayer to a few micrometers.

While the semiconductor device described above has often been referred to as a laser, our invention can also be utilized in conjunction with other semiconductor devices, such as, light emitting diodes, photo detectors (both photoconductive and photovoltaic types), quantum well and superlattice based devices, or other semiconductor devices having characteristics which are affected by stress or pressure.

In all of the embodiments of our invention a piezoelectric film generates a stress (either compressive or tensile) which is transmitted to the semiconductor material. This stress effects the energy gap of the semiconductor material, thereby changing its operating characteristics.

We claim:

1. In an electrooptic semiconductor device having a body of an electrooptic substance and a pair of electrodes positioned against said body connectable to a pumping voltage source, the improvement comprising at least one thin film of a piezoelectric substance connectable to a tuning voltage source positioned against said body of electrooptic substance so as to produce stress therein when said tuning voltage is applied thereto, whereby the spectral response of said device is varied.

2. The electrooptic device of claim 1 including two thin films of a piezoelectric substance connectable to a tuning voltage source positioned against said semiconductor device opposite each other.

3. The electrooptic device of claim 1 in which said electrooptic substance is a semiconductor laser.

4. The electrooptic device of claim 3 in which said electrooptic substance is a double heterostructure GaAs/AlGaAs semiconductor laser.

5. The electrooptic device of claim 3 in which said thin film of piezoelectric substance is a film selected from the group consisting of barium titanate, zinc oxide, lead titanate, lead zirconate, lead zirconium titanate and lithium niobate.

6. In a stress responsive semiconductor device having a first pair of electrodes connectable to a first electrical circuit positioned against said semiconductor device opposite each other, the improvement comprising at least one thin film of a piezoelectric substance positioned in stress transmitting relation with said semiconductor device and connectable to a second electrical circuit, whereby energization of said second electrical circuit causes said piezoelectric thin film to transmit stress to said semiconductor device, thereby varying the response of said semiconductor device in correspondence with said second electrical circuit energization.

7. The device of claim 6 in which said semiconductor device is a semiconductor laser diode.

8. The device of claim 6 in which said semiconductor device is a light emitting semiconductor diode.

9. The device of claim 6 in which said semiconductor device is a light sensitive semiconductor diode.

10. The device of claim 6 in which said semiconductor device and said thin film of piezoelectric substance are affixed to said substrate on the same side thereof.

11. The device of claim 6 in which said semiconductor device and said thin film of piezoelectric substance are affixed to said substrate on opposite sides thereof.

12. The device of claim 6 in which said semiconductor device is a surface-emitting semiconductor laser.

13. The device of claim 6 in which said semiconductor device is a quantum well device.

14. The device of claim 6 in which said second electrical circuit is an alternating current circuit.

15. The device of claim 6 in which said second electrical circuit is a direct current signal.

16. The device of claim 6 in which said semiconductor device is at least partially surrounded by said thin film.

17. The device of claim 6 in which said semiconductor device is encapsulated in said thin film.

18. The device of claim 6 including first and second thin films of piezoelectric substance affixed to said substrate in stress transmitting relation with said semiconductor device, said first and second thin films being electrically separated from each other, said second thin film being connectable to a third electrical circuit for carrying a signal having an electrical phase relation shifted 180° from the signal of said second electrical circuit.

19. The device of claim 6 including first and second thin films of piezoelectric substance affixed to said substrate in stress transmitting relation with said semiconductor device, said first and second thin films being electrically separated from each other, said second thin film being connectable to a third electrical circuit for carrying a signal having an opposite polarity from the signal of said second electrical circuit.

20. The device of claim 6 including on opposite sides of said semiconductor device at least two thin films of piezoelectric substance sandwiched with at least three flat electrodes, said films and said electrodes being normal to said semiconductor device and to said substrate, means for electrically connecting together said oppositely positioned electrodes, and means for electrically connecting alternate pairs of said electrodes.

* * * * *